United States Patent
Pei

(10) Patent No.: US 8,430,964 B2
(45) Date of Patent: Apr. 30, 2013

(54) COATING APPARATUS

(75) Inventor: Shao-Kai Pei, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 574 days.

(21) Appl. No.: 12/713,343

(22) Filed: Feb. 26, 2010

(65) Prior Publication Data

US 2011/0011339 A1   Jan. 20, 2011

(30) Foreign Application Priority Data

Jul. 20, 2009   (CN) .......................... 2009 1 0304520

(51) Int. Cl.
*C23C 16/00* (2006.01)
*C23C 14/00* (2006.01)

(52) U.S. Cl.
USPC .. 118/719; 118/730; 204/298.23; 204/298.27

(58) Field of Classification Search .................. 118/719, 118/728–730; 204/298.23, 298.25–298.28
See application file for complete search history.

(56) References Cited

U.S. PATENT DOCUMENTS

| | | | |
|---|---|---|---|
| 3,443,362 A | | 5/1969 | Ebert |
| 3,492,790 A | | 2/1970 | Ebert |
| 3,874,525 A | * | 4/1975 | Hassan et al. .............. 414/744.4 |
| 5,562,800 A | * | 10/1996 | Kawamura et al. ........... 414/806 |
| 5,667,592 A | * | 9/1997 | Boitnott et al. ............... 118/719 |
| 6,382,895 B1 | * | 5/2002 | Konishi et al. ................ 414/217 |
| 6,391,114 B1 | * | 5/2002 | Kirimura ...................... 118/719 |
| 2002/0137346 A1 | * | 9/2002 | Donaldson et al. ........... 438/694 |
| 2003/0003767 A1 | * | 1/2003 | Kim et al. ..................... 438/763 |
| 2005/0268848 A1 | * | 12/2005 | Wang ............................ 118/719 |

FOREIGN PATENT DOCUMENTS

| | | |
|---|---|---|
| DE | 1457304 B | 4/1975 |
| JP | 63065071 A | 3/1988 |
| JP | 2000218659 A | 8/2000 |

* cited by examiner

*Primary Examiner* — Karla Moore
(74) *Attorney, Agent, or Firm* — Altis Law Group, Inc.

(57) ABSTRACT

A coating apparatus includes a chamber device and a transporting device. The chamber device defines two separated coating chambers, two coating channels, which are alternately arranged, two coating slots communicating the coating chambers with the coating channels respectively, and a transportation channel extending to intersect the coating chambers and the coating channels and communicate with the coating channels. The transporting device includes a carrying board for carrying a substrate to be coated and a driver for driving the carrying board to move along the transportation channel and to rotate the carrying board into one of the coating channels so that the substrate faces and aligns a corresponding coating chamber via a corresponding coating slot.

10 Claims, 3 Drawing Sheets

COATING APPARATUS

BACKGROUND

1. Technical Field

This present disclosure relates to coating apparatuses and, particularly, to a coating apparatus for multi-layer coating.

2. Description of Related Art

It is not uncommon to use more than one kind of coating process, such as, spraying, ion sputtering, vapor deposition, or spray pyrolysis when applying multiple coats of materials such as paint or primer to a workpiece. Generally, each coating process must be carried out within a different vacuumized chamber of a machine capable of carrying out the desired coating process. However, in using separate vacuum chambers in the coating process the workpiece is exposed to the environment between the chambers and may be contaminated.

Therefore, it is desirable to provide a coating apparatus, which can overcome the above-mentioned limitations.

DETAILED DESCRIPTION

Figure 1:
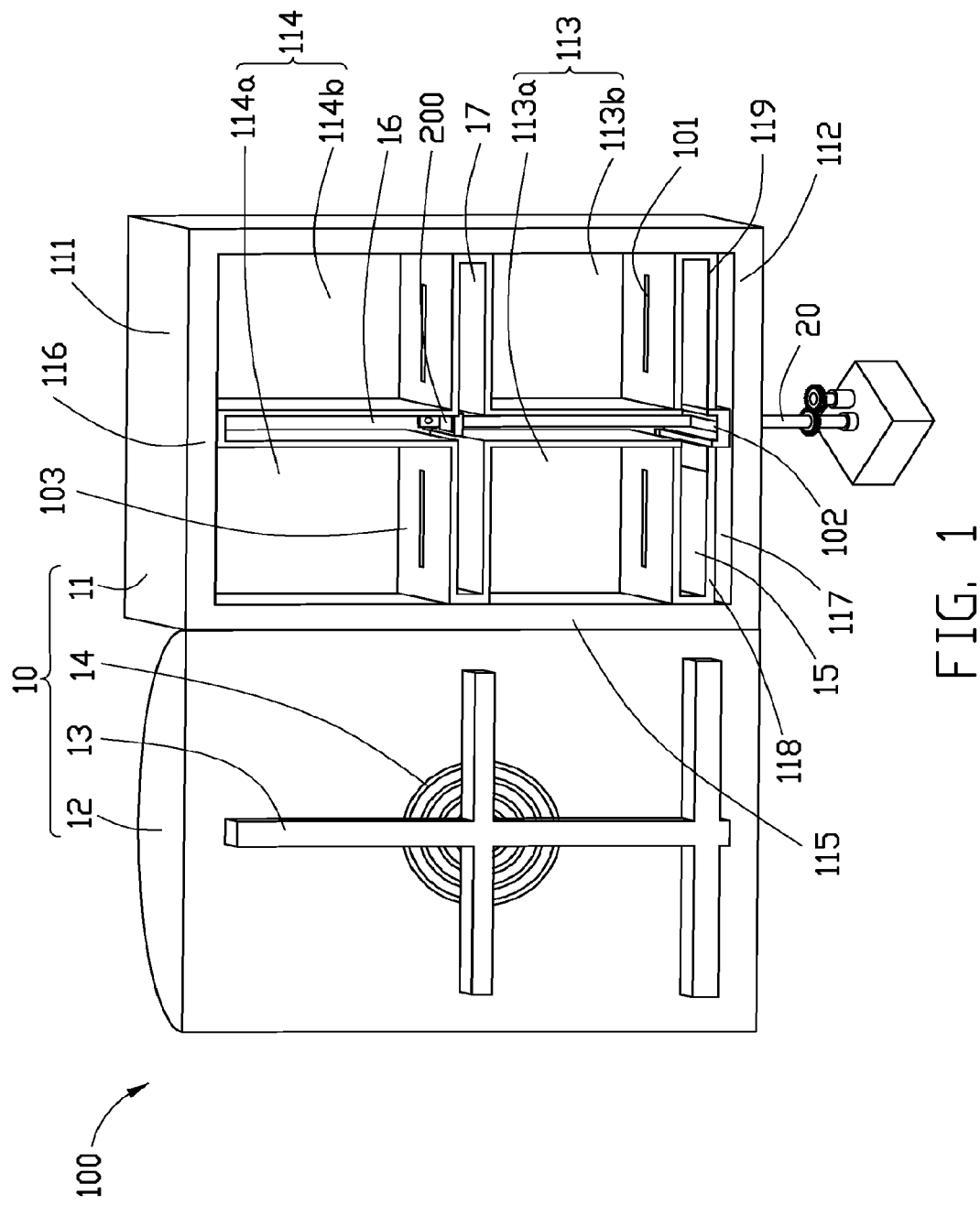
FIG. 1 is an isometric view of a coating apparatus, according to an exemplary embodiment.

Referring to FIG. 1, a coating apparatus 100, according to an exemplary embodiment, is used to coat two substrates 200 at the same time. The coating apparatus 100 includes a chamber device 10 and a transporting device 20. Basically the coating apparatus 100 is a multi-chambered apparatus allowing the use of more than one kind of coating process without having to move workpieces out of one machine to another and thus risk contamination.

The chamber device 10 includes a chamber body 11, a chamber door 12, a sealing element 13, and an elastic element 14.

The chamber body 11 is generally cubic and includes a front surface 116. The chamber body 11 defines a groove 117 in the front surface 116 mainly along the width and the height of the chamber body 11. The groove 117 defines a bottom surface 118.

The chamber body 11, cooperates with the chamber door 12 (see below), a first coating chamber 113a, a second coating chamber 113b, a third coating chamber 114a, and a fourth coating chamber 114b in the bottom surface 118, generally at lower left, lower right, upper left, and upper right portions thereof respectively. The coating chambers 113a, 113b, 114a, and 114b are generally cubic too and are similar to each other in shape and size. The coating chambers 113a, 113b, 114a, and 114b extend along the width, the depth, of the height of the chamber body 11, thereby forming a left plate 115, a top plate 111, and a bottom plate 112 of the chamber body 11. Each of the coating chambers 113a, 113b, 114a, and 114b defines a lower surface 103. The coating chambers 113a and 113b constitute a lower coating chamber section 113. The coating chambers 114a and 114b constitute an upper coating chamber section 114.

The chamber body 11 also defines a lower coating channel 15, an upper coating channel 17, and a transportation channel 16. The lower coating channel 15 is beneath the lower coating chamber section 113. The upper coating channel 17 is interposed between the lower coating chamber section 113 and the upper coating chamber section 114. The coating channels 15 and 17 are similar to each other in shape and size, and both mainly extend along the width and the depth of the chamber body 11. The transportation channel 16 is interposed between the first coating chamber 113a and the second coating chamber 113b, and also between the third coating chamber 114a and the fourth coating chamber 114b. The transportation channel 16 mainly extends along the width and the height of the chamber body 11, intersects and communicates with the lower coating channel 15 and the upper coating channel 17. The lower coating channel 15, the upper coating channel 17, and the transportation channel 16 cooperatively define an opening 119 in the bottom surface 118. The chamber body 11 also defines four coating slots 101.

Two of the coating slots 101 communicate between lower coating channel 15 and the coating chambers 113a and 113b respectively, where the other two communicate with the upper coating channel 17 with the coating chambers 114a and 114b respectively. The coating slots 101 are positioned generally at the center of the lower surfaces 103 respectively and extend along the width direction of the chamber body 11. The coating slots 101 are shaped and sized corresponding to the substrates 200.

The chamber body 11 also defines a hole 102 through the bottom plate 112, generally at the center thereof, along the height direction of the chamber body 11. The through hole 102 communicates the transportation channel 16 with the external of the chamber body 11.

The chamber door 12 is substantially similar to the front surface 116 in shape and size. The chamber door 12 has one of two sides hinged to the intersection of the front surface 118 and the left plate 115. So the chamber door 12 can be opened or closed to cover or uncover the front surface 116 or the groove 117 and the coating chambers 113a, 113b, 114a, and 114b.

The sealing element 13 is rectangular rod structure and shaped and sized so as to hermetically seal the opening 119.

The elastic element 14 is a coil spring and is configured for a pliant connection of the sealing element 13 to the chamber door 12, generally at the center of a surface thereof facing the front surface 116. As such, when the chamber door 12 is closed, the elastic element 14 pliably pushes the sealing member 13 into the opening 19 to hermetically seal the opening 19.

Figure 2:
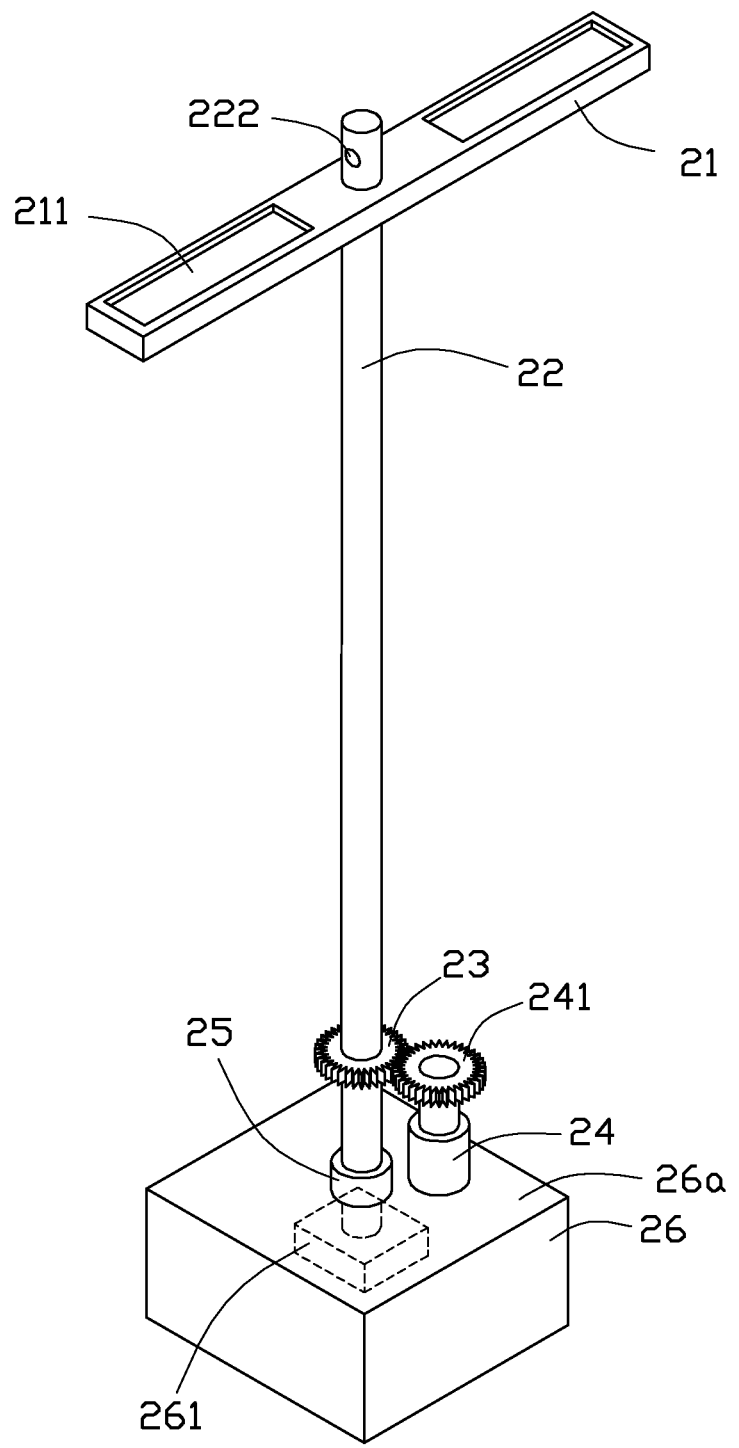
FIG. 2 is an isometric view of a transporting device of the coating apparatus of FIG. 1.

Referring to FIG. 2, the transportation device 20 includes a carrying board 21, a shaft 22, a transmission gear 23, a motor 24, a bearing 25, and an actuating platform 26.

The carrying board 21 is shaped corresponding to but slightly smaller than the horizontal cross-section of the transportation channel 16. Thus, the carrying board 21 can freely move along the transportation channel 16. The carrying board 211 defines two receiving grooves 211 in one surface thereof, for receiving the substrates respectively. The receiving grooves 211 are symmetrically located at two sides of the carrying board 21 and correspond to the coating slots 101.

Figure 3:
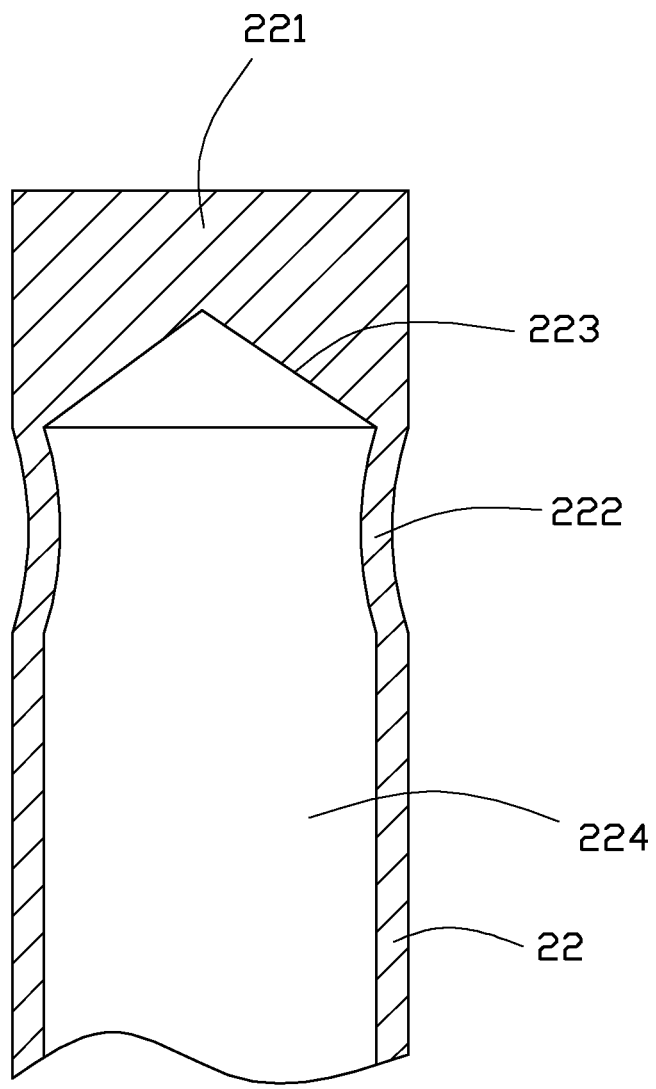
FIG. 3 is a partial, cross-sectional view of a shaft of the transporting device of FIG. 2.

Referring to FIG. 3, the shaft 22 is hollow, and defines an air channel 224. The shaft 22 includes a closed end 221. The air channel 223 is tapered off to the closed end 221, thereby forming a conical guiding portion 223 closed to the closed end 221. The shaft 22 defines two vents 222 in the circumference of the surface thereof, close to the closed end 221.

The motor 24 includes a driving gear 241 that matches the transmission gear 23. The actuating platform 26 is configured for raising or lowering the shaft 22 and includes a top wall 26a and an ionized gas source 261 accommodated therein.

Referring back to FIG. 1, in assembly, the carrying board 21 is received in the intersection of the lower coating channel 15 and the transportation channel 16. The shaft 22 protrudes outside from the actuating platform 26 (e.g., the top wall 26a) and extends through the hole 102 and the carrying board 21, generally at the center thereof. The shaft 22 is connected to the top wall 26a via the bearing 25. As such, the shaft 22 can rotate relative to the actuating platform 26. The vents 222 are positioned above the carrying board 21, and directly point to the receiving grooves 211 respectively, and communicate with the ionized gas source 261 through the air channel 224. The transmission gear 23 is coaxially fixed to the shaft 22, close to the actuating platform 26. The motor 24 is disposed on the top wall 26a so that the driving gear 241 meshes with the transmission gear 23.

In operation, the two substrates 200 are placed in the receiving grooves 211 respectively. Then the chamber door 12 is closed so that the opening 19 is sealed by the sealing element 13. The ionized gas source 261 starts to blow ionized gas to the substrates 200 via the air channel 224 and the vents 222 respectively protect the substrates 200 from contamination. It is noteworthy that the guiding portion 223 is to guide the ionized gas to the substrates 200.

Then the motor 24 rotates the carrying board 21 into the lower coating channel 15 so that the substrates 200 are exposed to the first coating chamber 113a and the second coating chamber 113b via the coating slots 101 respectively. Consequently, the ionized gas source 261 is stopped and a corresponding coating process is carried out within the coating chambers 133a and 133b, respectively. The substrates 200 are thus coated with a layer (not shown).

When the coating process is finished, the ionized gas source 261 restarts, the carrying board 21 is rotated back to the transportation channel 16 and is driven to the intersection of the transportation channel 16 and the upper coating channel 17. Then the carrying board 21 is rotated in the upper coating channel 17 so that the substrates 200 are exposed to the coating chambers 114a and 114b via the coating slots 101 respectively. The ionized gas source 261 is stopped again, and another coating process is carried out in the coating chambers 114a and 114b for coating another layer on the substrate. After the coating process is finished. The chamber door 12 can be opened to access the substrates 200.

It is noteworthy that the chamber device 10 is for providing at least two coating chambers, two coating channels, two coating slots, and a transportation channel, wherein the coating chambers and the coating channels are alternately arranged and communicated through the corresponding coating slots; and the transportation channel extends to intersect the coating chambers and the coating channels and communicates with the coating channels. Therefore, the chamber device 10 is not limited to the configuration of this embodiment. For example, more than two coating chambers can be deployed. For example, additional middle coating chamber section interposed between the lower coating chamber section and the upper coating chamber section can be deployed.

Also, more then one coating slot can be formed in one lower surface. As such, the carrying board defines more than two carrying grooves corresponding to the coating slots for coating more than two substrates at the same time. The left coating chambers 113a and 114a and left portions of the coating channels 15 and 17 can be canceled as well in other alternative embodiments, provided the coating efficiency is sufficient.

If the sealing element 13 is perfectly matched to the opening in position, the elastic element 14 can be omitted. Further, if the coating chambers 113a, 113b, 114a, and 114b are directly defined in the front surface 116, the sealing element 13 can be omitted too.

The shaft 22, the transmission gear 23, the motor 24, the bearing 25, and the actuating platform 26 constitute a driver to drive the carrying board 21 to move along the transportation channel 16 and to rotate the carrying board 21 into the coating channels 15 and 17. However, the driver is not limited to this embodiment but can be any other configuration equating thereto.

While various exemplary and preferred embodiments have been described, it is to be understood that the disclosure is not limited thereto. To the contrary, various modifications and similar arrangements (as would be apparent to those skilled in the art), are also covered. Therefore, the scope of the appended claims should be accorded the broadest interpretation so as to encompass all such modifications and similar arrangements.

What is claimed is:

1. A coating apparatus comprising:
    a chamber device defining two separated coating chamber sections, two coating channels, two coating slots, and a transportation channel; the coating chamber sections and the coating channels being alternately arranged substantially along a height direction of the chamber device; the coating slots communicating each coating channel to an adjacent coating chamber section; the transportation channel extending substantially along the height direction of the chamber device to intersect the coating slots and the coating chamber sections to divide each coating chamber section into two coating chambers, and the transportation channel communicating with the two coating channels; and
    a transporting device comprising a carrying board and an a driver; the carrying board being movably received within the transportation channel and defining a receiving groove for receiving a substrate; the driver being configured to drive the carrying board to move along the transportation channel and to rotate the carrying board to move into or out of the coating channels; when the carrying board is moved in one of the coating channels, the receiving groove faces and aligns with a corresponding coating chamber via a corresponding coating slot;
    wherein the chamber device comprises a chamber body and a chamber door; the coating chambers, the coating channels, the transportation channel, and the coating slots being defined in the chamber body, the chamber door being hinged to the chamber body to open or close the coating chambers;
    wherein the chamber body comprises a front surface; the chamber door being configured for covering the front surface; the coating chambers, the coating channels, and the transportation channel, being defined in the front surface.

2. The coating apparatus of claim 1, wherein the chamber body comprises a front surface; the chamber door being configured for covering the front surface; the chamber body defining a groove in the front surface; the groove defining a bottom surface; the coating chambers, the coating channels, and the transportation channel being defined in the bottom surface; the coating channels and the transportation channel defining an opening in the bottom surface; the chamber device further comprising a sealing element attached to the chamber door to hermetically seal the opening when the chamber door is closed.

3. The coating apparatus of claim 2, wherein the chamber device comprises an elastic element, the elastic element is configured to connect the sealing element to the chamber door and elastically urges the sealing element to hermetically seal the opening when the chamber door is closed.

4. The coating apparatus of claim 3, wherein the elastic element comprises a coil spring.

5. The coating apparatus of claim 1, wherein the chamber body comprises an upper plate, a bottom plate, and a side plate connecting the upper plate and the bottom plate, the coating channel and the coating chamber sections being alternately arranged from the bottom plate to the upper plate, a side of the chamber door being hinged to the intersection of the front surface and the side plate.

6. The coating apparatus of claim 1, wherein the coating slots are shaped conforming to the substrate.

7. The coating apparatus of claim 1, wherein the driver comprises a shaft, an actuating platform, and a motor; the shaft protruding from the actuating platform and being connected to the carrying board; the actuating platform being configured for actuating the shaft to move along the transportation channel; the motor being configured for driving the shaft to spin to rotate the carrying board.

8. The coating apparatus of claim 7, wherein the driver comprises a bearing, a transmission gear; the shaft being connected to the actuating platform via the bearing; the motor being disposed on the actuating platform and comprising a driving gear; the transmission gear being coaxially fixed to the shaft, and meshed with the driving pear.

9. The coating apparatus of claim 7, wherein the driver comprises an ionized gas source; the shaft defining a channel that communicates with the ionized as source; the shaft protruding through the carrying board and further defining a vent that is for directing ionized gas to the substrate via the channel.

10. The coating apparatus of claim 9, wherein the channel is tapered off to an end adjacent to the carrying board and thereby forming a conical guiding portion to guide the ionized gas to the vent and to the substrate.

* * * * *